(12) United States Patent
Abe

(10) Patent No.: US 12,464,637 B2
(45) Date of Patent: Nov. 4, 2025

(54) IDENTIFICATION CIRCUIT AND IDENTIFICATION METHOD

(71) Applicant: Yokogawa Electric Corporation, Tokyo (JP)

(72) Inventor: Taisuke Abe, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 155 days.

(21) Appl. No.: 18/100,893

(22) Filed: Jan. 24, 2023

(65) Prior Publication Data

US 2023/0269865 A1 Aug. 24, 2023

(30) Foreign Application Priority Data

Feb. 18, 2022 (JP) ................................ 2022-024298

(51) Int. Cl.
  *G01R 31/28* (2006.01)
  *G01D 21/00* (2006.01)
  *H05K 1/02* (2006.01)

(52) U.S. Cl.
  CPC ........... *H05K 1/0266* (2013.01); *G01D 21/00* (2013.01)

(58) Field of Classification Search
  CPC .................................................... G01D 21/00
  See application file for complete search history.

(56) References Cited

U.S. PATENT DOCUMENTS

2003/0023777 A1* 1/2003 Fields ................. H04L 61/5038
                                                    710/3
2006/0067715 A1   3/2006 Nakashima
2006/0282724 A1* 12/2006 Roulo ..................... G06F 1/189
                                                   714/724

FOREIGN PATENT DOCUMENTS

| JP | S5730964 A | 2/1982 |
| JP | H06138991 A | 5/1994 |
| JP | 2006091491 A | 4/2006 |
| JP | 2009204178 A | 9/2009 |

(Continued)

OTHER PUBLICATIONS

Japanese Office Action dated Apr. 2, 2024 for Japanese Patent Application No. 2022-024298; English translation.

(Continued)

*Primary Examiner* — Alesa Allgood
(74) *Attorney, Agent, or Firm* — RANKIN, HILL & CLARK LLP

(57) ABSTRACT

An identification circuit (10) for identifying one circuit board (30) among a plurality of circuit boards (30) includes a switching element (11) that switches the one circuit board (30) electrically connected to the identification circuit (10) among the plurality of circuit boards (30), a circuit element group (12) electrically connected to the switching element (11), and a controller (13) electrically connected to the switching element (11) and the circuit element group (12). Upon an identification resistor (Ri) and/or an identification capacitor (Ci) being electrically connected to the circuit element group (12) via the switching element (11), the controller (13) measures a determination time (T), which is different for each circuit board (10), based on the connected identification resistor (Ri) and/or the connected identification capacitor (Ci) and identifies the one circuit board (30) based on the measured determination time (T).

11 Claims, 5 Drawing Sheets

(56) References Cited

FOREIGN PATENT DOCUMENTS

| | | | |
|---|---|---|---|
| JP | 2011238380 A | 11/2011 |
| JP | 2015-87833 A | 5/2015 |

OTHER PUBLICATIONS

Japanese Office Action (JPOA) mailed on Jan. 9, 2024 issued for Japanese patent application No. 2022-024298 and its English machine translation.
European Office Action dated Aug. 21, 2025 issued for European patent application No. 23153772.1.

\* cited by examiner

IDENTIFICATION CIRCUIT AND IDENTIFICATION METHOD

CROSS-REFERENCE TO RELATED APPLICATION

The present application claims priority to Japanese Patent Application No. 2022-024298 filed on Feb. 18, 2022, the entire contents of which are incorporated herein by reference.

TECHNICAL FIELD

The present disclosure relates to an identification circuit and an identification method.

BACKGROUND

Technology related to identification circuits that identify one circuit board among a plurality of circuit boards is known.

For example, Patent Literature (PTL) 1 discloses a signal processing apparatus that can identify interface modules, including circuit boards, without a significant increase in cost and the amount of wiring.

CITATION LIST

Patent Literature

PTL 1: JP 2015-087833 A

SUMMARY

An identification circuit according to several embodiments is an identification circuit for identifying one circuit board among a plurality of circuit boards, the identification circuit including:
 a switching element configured to switch the one circuit board electrically connected to the identification circuit among the plurality of circuit boards;
 a circuit element group electrically connected to the switching element; and
 a controller electrically connected to the switching element and the circuit element group, wherein
 upon an identification resistor and/or an identification capacitor being electrically connected to the circuit element group via the switching element, the controller is configured to measure a determination time, which is different for each circuit board, based on the connected identification resistor and/or the connected identification capacitor and to identify the one circuit board based on the measured determination time.

BRIEF DESCRIPTION OF THE DRAWINGS

In the accompanying drawings.

DETAILED DESCRIPTION

Figure 1:
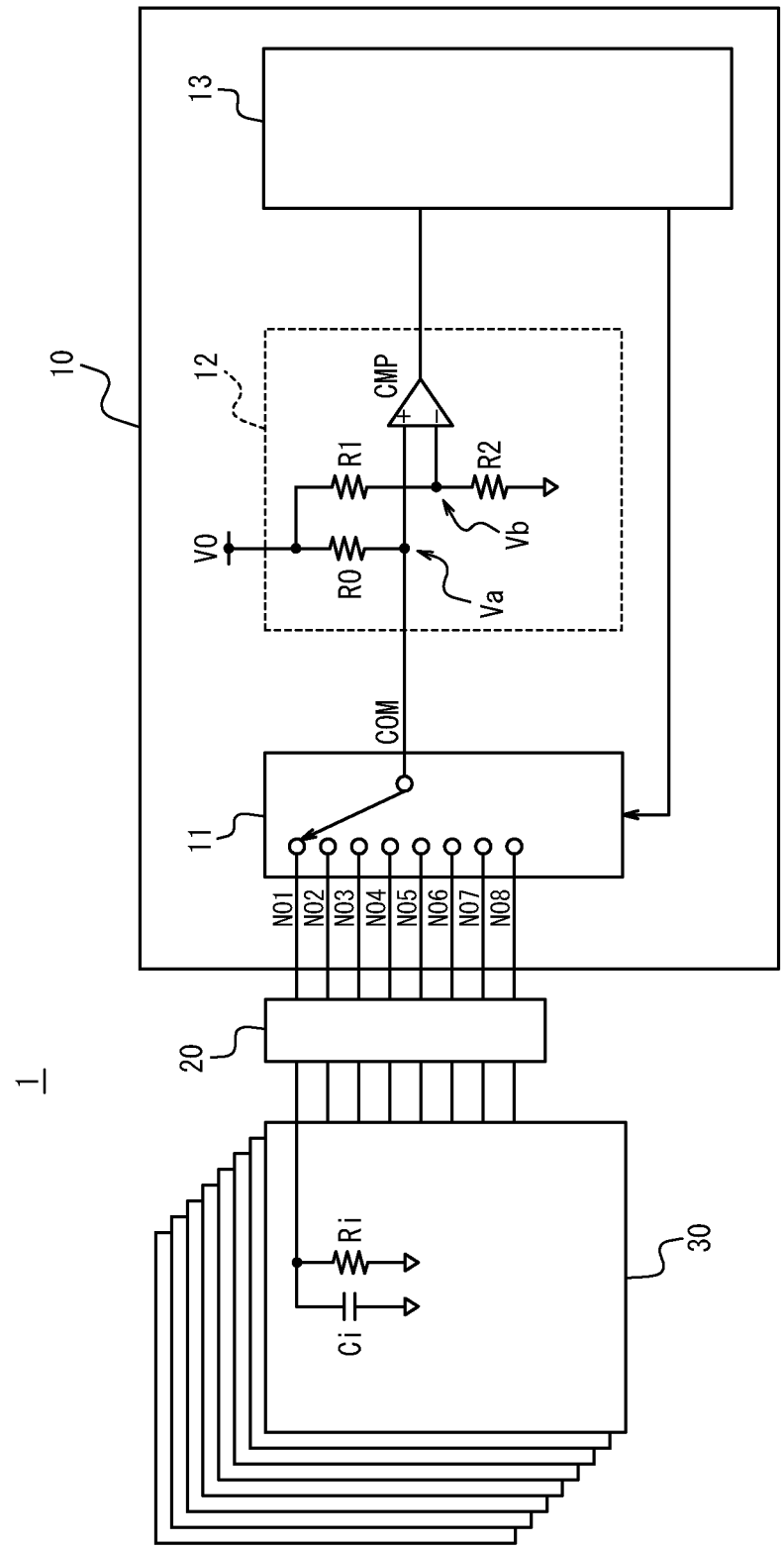
FIG. 1 is a configuration diagram schematically illustrating an identification circuit according to a first embodiment of the present disclosure.

In the technology described in PTL 1, an analog-to-digital converter (ADC) is used in the identification circuit, and the cost, including development cost and product cost, has not been sufficiently controlled.

It would be helpful to provide an identification circuit and identification method that can sufficiently control costs.

An identification circuit according to several embodiments is an identification circuit for identifying one circuit board among a plurality of circuit boards, the identification circuit including:
 a switching element configured to switch the one circuit board electrically connected to the identification circuit among the plurality of circuit boards;
 a circuit element group electrically connected to the switching element; and
 a controller electrically connected to the switching element and the circuit element group, wherein
 upon an identification resistor and/or an identification capacitor being electrically connected to the circuit element group via the switching element, the controller is configured to measure a determination time, which is different for each circuit board, based on the connected identification resistor and/or the connected identification capacitor and to identify the one circuit board based on the measured determination time.

This configuration can sufficiently control costs. For example, the identification circuit does not include an ADC, and the controller does not need to control an ADC. The development cost is therefore reduced compared to conventional technology in which such an ADC is included in the identification circuit. The product cost is also reduced, since an ADC, which is an expensive circuit element, is not used in the identification circuit, but rather only inexpensive circuit elements are used.

In the identification circuit according to an embodiment, the controller may be configured to measure the determination time, which is different for each circuit board, based on the identification resistor and/or the identification capacitor that are connected to each other in parallel and are included in the one circuit board. This configuration enables the user to design the resistance value of the identification resistor and/or the capacitance value of the identification capacitor of the circuit board to be different for each circuit board, so that the identification circuit can easily and accurately identify the one circuit board based on the determination time.

In addition, by the identification resistor and the identification capacitor being connected in parallel with each other on the one circuit board, the identification capacitor is discharged by the identification resistor when the one circuit board is not selected by the switching element. As a result, the charge on the identification capacitor becomes zero. When one circuit board is selected by the switching element and the identification process of the one circuit board by the identification circuit starts, the controller can therefore accurately measure the determination time. The identification accuracy of the one circuit board by the identification circuit is thereby improved.

The identification circuit according to an embodiment may include the identification capacitor, and the controller may be configured to measure the determination time, which is different for each circuit board, based on the identification resistor included in the one circuit board. By having the identification capacitor be included in the identification circuit instead of in the circuit board, the identification process can be performed for existing circuit boards in which the identification capacitor is not provided. This improves the compatibility of the identification circuit with existing circuit boards.

In the identification circuit according to an embodiment, the identification capacitor may be connected to a terminal of the switching element on the one circuit board side of the switching element. Thereby, the identification circuit can identify the one circuit board based on the same identification method as when the one circuit board selected by the switching element includes the identification resistor and the identification capacitor connected in parallel with each other.

In the identification circuit according to an embodiment, the controller may be configured to calculate the determination time based on a resistance value of the identification resistor and a capacitance value of the identification capacitor. This enables acquisition of the determination parameters required for the identification process of the one circuit board as the determination time expressed by Equation 5, described below. The identification circuit can provide a new identification method using the time axis, which is completely different from an identification method using a voltage range as in conventional technology.

In the identification circuit according to an embodiment, the circuit element group may include a buffer circuit and include a resistor and the identification capacitor connected in this order to the buffer circuit in series. This configuration reduces the influence from the identification capacitor of the identification circuit according to an embodiment on an identification circuit based on conventional technology, thereby enabling the identification circuit based on conventional technology to identify the one circuit board accurately.

In the identification circuit according to an embodiment, the controller may be configured to calculate the determination time based on a resistance value of the resistor and a capacitance value of the identification capacitor. This enables acquisition of the determination parameters required for the identification process of the one circuit board as the determination time expressed by Equation 6, described below. The identification circuit can provide a new identification method using the time axis, which is completely different from an identification method using a voltage range as in conventional technology.

In the identification circuit according to an embodiment, the circuit element group may include a converter configured to output, to the controller, an electrical signal that changes from Lo to Hi when the determination time elapses after electrical connection is switched to the one circuit board by the switching element, and the controller may be configured to measure the determination time based on the electrical signal. In this way, the controller can accurately measure the determination time. The identification accuracy of the one circuit board by the identification circuit is thereby improved.

An identification method according to several embodiments is an identification method using an identification circuit for identifying one circuit board among a plurality of circuit boards, the identification method including:

switching the one circuit board electrically connected to the identification circuit among the plurality of circuit boards;

measuring, upon an identification resistor and/or an identification capacitor being electrically connected to a circuit element group of the identification circuit by switching of the one circuit board, a determination time, which is different for each circuit board, based on the connected identification resistor and/or the connected identification capacitor; and identifying the one circuit board based on the measured determination time.

This configuration can sufficiently control costs. For example, the identification circuit does not include an ADC, and the controller does not need to control an ADC. The development cost is therefore reduced compared to conventional technology in which such an ADC is included in the identification circuit. The product cost is also reduced, since an ADC, which is an expensive circuit element, is not used in the identification method, but rather only inexpensive circuit elements are used.

The identification method according to an embodiment may further include calculating the determination time based on a resistance value of the identification resistor and a capacitance value of the identification capacitor. This enables acquisition of the determination parameters required for the identification process of the one circuit board as the determination time expressed by Equation 5, described below. The identification method can be implemented as a new method using the time axis, which is completely different from an identification method using a voltage range as in conventional technology.

According to the present disclosure, an identification circuit and identification method that can sufficiently control costs can be provided.

The background and problems with conventional technology are described in greater detail.

A conventional identification circuit 100 is illustrated in the upper half of FIG. 5, described below. The conventional identification circuit 100 illustrated in FIG. 5 identifies one circuit board 30 among a plurality of circuit boards 30. The identification circuit 100 identifies the type of the one circuit board 30 included among the plurality of circuit boards 30 mounted on the connector 200.

The identification circuit 100 includes, in order from the connector 200 side, a switching element 110, a circuit element group 120, and a controller 130. The identification circuit 100 is electrically connected to one circuit board 30 among the plurality of circuit boards 30 by the switching element 110 switching the electrical connection.

At this time, the divided voltage Va is calculated by the following equation from a reference voltage V0 of the identification circuit 100, a reference resistor R0 included in the circuit element group 120, and an identification resistor Ri of the one circuit board 30.

$$Va = V0 \times \left(\frac{Ri}{R0 + Ri}\right) \quad \text{(Equation 1)}$$

In the operational amplifier OP, which buffers current from flowing to the ADC side, the voltage on the output terminal is the same as the voltage Va on the non-inverting input terminal. The output voltage Va from the operational amplifier OP is converted from analog to digital in the ADC. The controller 130 identifies the type of circuit board 30 mounted on the connector 200 based on the voltage outputted from the ADC. The voltage Va is a different value for each circuit board 30, since the identification resistor Ri included in Equation 1 is different for each circuit board 30. The controller 130 can therefore identify the one circuit board 30 associated with the voltage outputted from the ADC from among a plurality of circuit boards 30.

This conventional identification circuit 100 has several problems. For example, in the identification circuit 100, the controller 130 needs to control the ADC, and the resulting necessary arithmetic processing leads to increased development costs. The identification circuit 100 uses an ADC, which is an expensive circuit element, thereby increasing the product cost.

In addition, the range of voltages Va that can be associated with a single circuit board 30 is limited in the identification circuit 100 due to errors caused by the reference voltage V0, the reference resistor R0, the identification resistor Ri, the operational amplifier OP, and the ADC. Therefore, a restriction is imposed on the number of identified circuit boards 30 mounted on the connector 200. If the number of identified circuit boards 30 were increased, the voltage range that could be associated with a single circuit board 30 would become narrower. In this case, a predetermined voltage Va that should normally be associated with one circuit board 30 might be included in the voltage range of another circuit board 30 due to the aforementioned error, causing the controller 130 to misidentify the circuit board 30. In the identification circuit 100, if the number of identified circuit boards 30 is to be increased, the reference voltage V0, the reference resistor R0, the identification resistor Ri, the operational amplifier OP, and the ADC need to be made more precise, leading to a further increase in costs.

In conventional modules that use the identification circuit 100, the voltage range of each circuit board 30 is already defined. Therefore, even if a circuit board 30 with a new function becomes necessary due to market needs, it is difficult to add the newly designed circuit board 30 to the plurality of circuit boards 30 for identification.

In light of these problems, it would be helpful to provide an identification circuit and identification method that can sufficiently control costs. Embodiments of the present disclosure are mainly described below with reference to the drawings.

First Embodiment

FIG. 1 is a configuration diagram schematically illustrating an identification circuit 10 according to a first embodiment of the present disclosure. The schematic configuration of the identification circuit 10 according to the first embodiment is mainly described with reference to FIG. 1.

A module 1 includes the identification circuit 10, a connector 20, and a plurality of circuit boards 30 mounted on the connector 20. The identification circuit 10 and the plurality of circuit boards 30 are electrically connected to each other via the connector 20. Each circuit board 30 includes an identification resistor Ri and an identification capacitor Ci connected to each other in parallel. The resistance value of the identification resistor Ri and/or the capacitance value of the identification capacitor Ci is different for each circuit board 30. For example, the resistance value of the identification resistor Ri may be identical for each circuit board 30, while the capacitance value of the identification capacitor Ci differs for each circuit board 30.

The identification circuit 10 identifies one circuit board 30 among the plurality of circuit boards 30. The identification circuit 10 includes, in order from the connector 20 side, a switching element 11, a circuit element group 12, and a controller 13. The switching element 11 is electrically connected to the connector 20. The circuit element group 12 is electrically connected to the switching element 11. The controller 13 is electrically connected to the switching element 11 and the circuit element group 12.

The switching element 11 includes, for example, a multiplexer. The switching element 11 has a plurality of connection terminals on the connector 20 side and one connection terminal on the opposite side from the connector 20. The switching element 11 has, for example, eight connection terminals NO1, NO2, NO3, NO4, NO5, NO6, NO7, and NO8 on the connector 20 side. The switching element 11 has a COM terminal on the opposite side from the connector 20.

The switching element 11 switches the one circuit board 30 electrically connected to the identification circuit 10 among the plurality of circuit boards 30 based on a control signal received from the controller 13. In other words, the switching element 11 selects the one circuit board 30 electrically connected to the identification circuit 10 among the plurality of circuit boards 30 based on a control signal received from the controller 13. For example, the switching element 11 switches the electrical connection relationship so that the one circuit board 30 connected to NO1 via the connector 20 is electrically connected to the identification circuit 10 based on the control signal received from the controller 13.

The circuit element group 12 is located between the switching element 11 and the controller 13 and includes a plurality of circuit elements. The circuit element group 12 includes a reference resistor R0, which receives the reference voltage V0, and resistors R1 and R2 connected in parallel with the reference resistor R0. The circuit element group 12 includes a comparator CMP connected to the reference resistor R0 and to the resistors R1 and R2.

A voltage Va is inputted at the non-inverting input terminal of the comparator CMP. The voltage Va is the result of dividing the reference voltage V0 based on the reference resistor R0 and the identification resistor Ri and has a maximum value of $Va_{max}$. A voltage Vb, which is the result of dividing the reference voltage V0 based on the resistors R1 and R2, is inputted at the inverting input terminal of the comparator CMP. The comparator CMP outputs an electrical signal as a digital signal to the controller 13. The electrical signal has either a Hi or Lo value depending on the magnitude of the voltage Va relative to the voltage Vb. More specifically, the comparator CMP outputs an electrical signal that is Hi to the controller 13 when the voltage Va is greater than the voltage Vb. The comparator CMP outputs an electrical signal that is Lo to the controller 13 when the voltage Va is smaller than the voltage Vb.

The controller 13 includes one or more processors. The controller 13 functions as a central processing unit (CPU). The "processor" in an embodiment is a general purpose processor or a dedicated processor specialized for particular processing, but these examples are not limiting. The controller 13 is electrically connected to each component of the identification circuit 10 and controls the operation of the entire identification circuit 10.

The processing by the controller 13 of the identification circuit 10 is now mainly described.

When the controller 13 is to identify the type of one circuit board 30 mounted in the connector 20, the switching element 11 switches the connection relationship from another circuit board 30 to the one circuit board 30. More specifically, the controller 13 controls the switching element 11 by outputting a control signal to the switching element 11. For example, the controller 13 controls the switching element 11 so that one circuit board 30 connected to the connection terminal NO1 of the switching element 11 via the connector 20 is electrically connected to the identification circuit 10.

Before the connection relationship is switched to one circuit board 30 by the switching element 11, the other circuit board 30 is electrically connected to the identification circuit 10. At this time, the identification capacitor Ci of one circuit board 30 is sufficiently discharged by the identification resistor Ri of the one circuit board 30.

The controller 13 measures the determination time upon both the identification resistor Ri and the identification capacitor Ci of the one circuit board 30 being electrically connected to the circuit element group 12 via the switching element 11. At this time, the determination time is different for each circuit board 30 based on the connected identification capacitor Ci. More specifically, the controller 13 measures the determination time, which is different for each circuit board 30, based on the identification resistor Ri and/or the identification capacitor Ci, which are connected to each other in parallel, included in the one circuit board 30. For example, the controller 13 measures the determination time based on the identification capacitor Ci. The controller 13 identifies the one circuit board 30 based on the measured determination time.

The method of calculating the determination time for identifying the type of the circuit board 30 mounted on the connector 20 is as follows.

The voltage $Va_{max}$ is calculated by the following equation from the reference voltage V0 of the identification circuit 10, the reference resistor R0 included in the circuit element group 12, and the identification resistor Ri of the one circuit board 30.

$$Va_{max} = V0 \times \left(\frac{Ri}{R0 + Ri}\right) \quad \text{(Equation 2)}$$

The determination voltage Vb in the comparator CMP is calculated by the following equation from the reference voltage V0 and the resistors R1 and R2 of the identification circuit 10.

$$Vb = V0 \times \left(\frac{R2}{R1 + R2}\right) \quad \text{(Equation 3)}$$

The determination time T of the comparator CMP with respect to the settling time of the voltage Va is calculated by the following equations.

$$\frac{Vb}{Va_{max}} = \left(1 - e^{-\frac{T}{Ci \times Ri}}\right) \quad \text{(Equation 4)}$$

$$T = -Ci \times Ri \times \ln\left(1 - \frac{Vb}{Va_{max}}\right) \quad \text{(Equation 5)}$$

Figure 2:
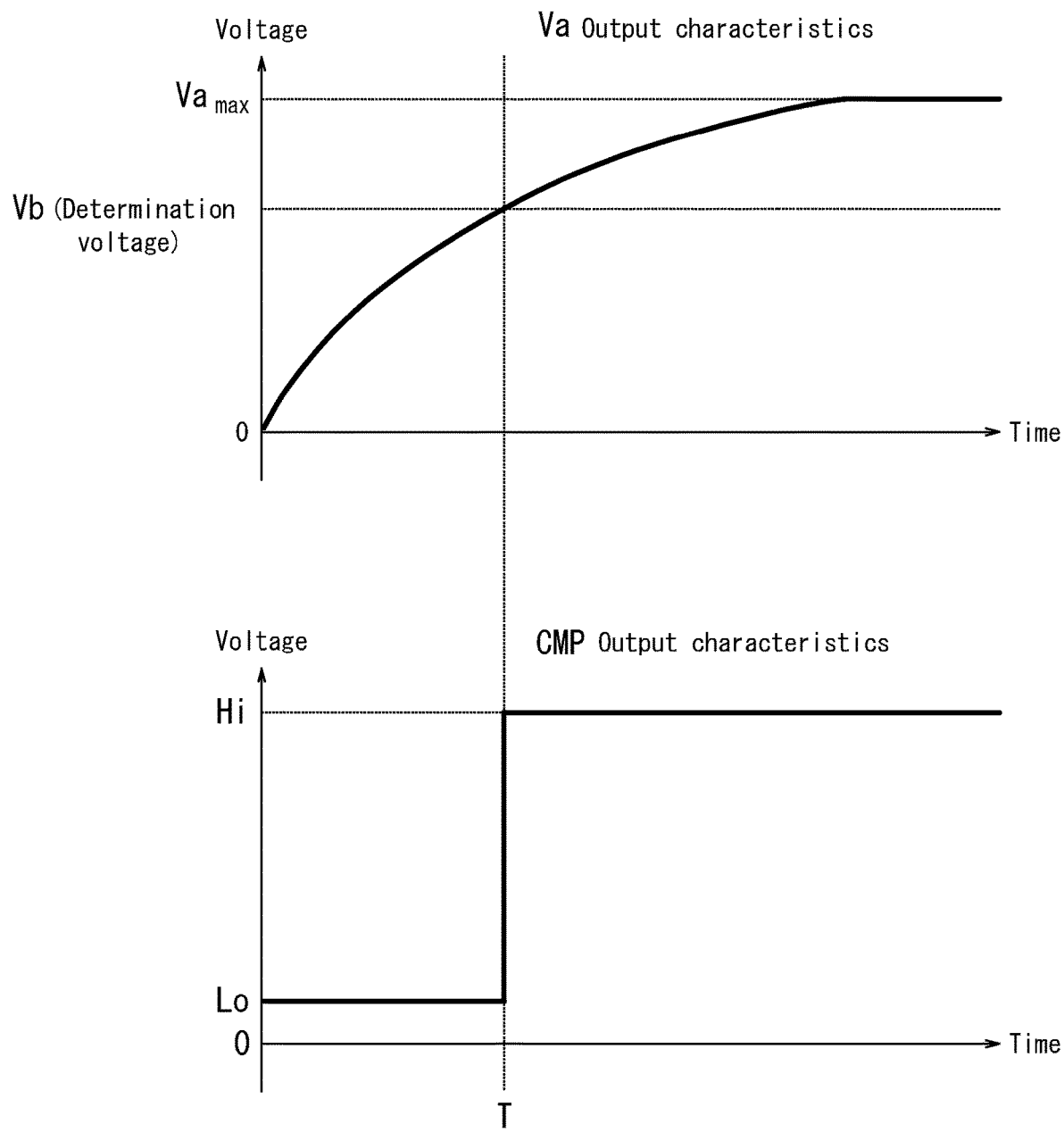
FIG. 2 is a diagram with graphs illustrating the output characteristics of a voltage Va and the output characteristics of a comparator CMP.

FIG. 2 is a diagram with graphs illustrating the output characteristics of the voltage Va and the output characteristics of the comparator CMP. The upper half of FIG. 2 illustrates a graph of the output characteristics of the voltage Va versus time. The lower half of FIG. 2 illustrates a graph of the output characteristics of the comparator CMP versus time. In the two graphs of FIG. 2, the time at which the connection relationship in the switching element 11 switches from the other circuit board 30 to the one circuit board 30 is set as time 0 (zero).

The voltage Va exhibits a transient response due to the arrangement of the identification capacitor Ci on the circuit board 30. More specifically, the voltage Va does not rise instantly to the voltage $Va_{max}$ at time 0 but rather rises slowly from zero voltage over a predetermined time. The determination voltage Vb is set to be smaller than the voltage $Va_{max}$. In other words, the voltage Va starts to rise from zero at time 0, becomes the same value as the determination voltage Vb at the determination time T, and then gradually rises to the voltage $Va_{max}$.

When such voltage Va is inputted to the non-inverting input terminal of the comparator CMP, the comparator CMP outputs, to the controller 13, an electrical signal that is Lo from time 0 until the determination time T elapses, i.e., while the voltage Va is less than the determination voltage Vb. Conversely, the comparator CMP outputs, to the controller 13, an electrical signal that is Hi after the determination time T elapses, i.e., after the voltage Va has become greater than the determination voltage Vb. As described above, the comparator CMP of the circuit element group 12 outputs, to the controller 13, an electrical signal that changes from Lo to Hi when the determination time T elapses after the electrical connection is switched by the switching element 11 to the one circuit board 30.

The controller 13 uses an internal counter of the controller 13 to measure the time it takes for the output voltage of the comparator CMP to change from Lo to Hi as the determination time T, based on the electrical signal outputted from the comparator CMP. The controller 13 identifies the type of the one circuit board 30 mounted on the connector 20 based on the measured determination time T. The determination time T is different for each circuit board 30, since the identification capacitor Ci included in Equation 5 takes a different value for each circuit board 30. The controller 13 can therefore identify the one circuit board 30 associated with the determination time T from among the plurality of circuit boards 30.

Figure 3:
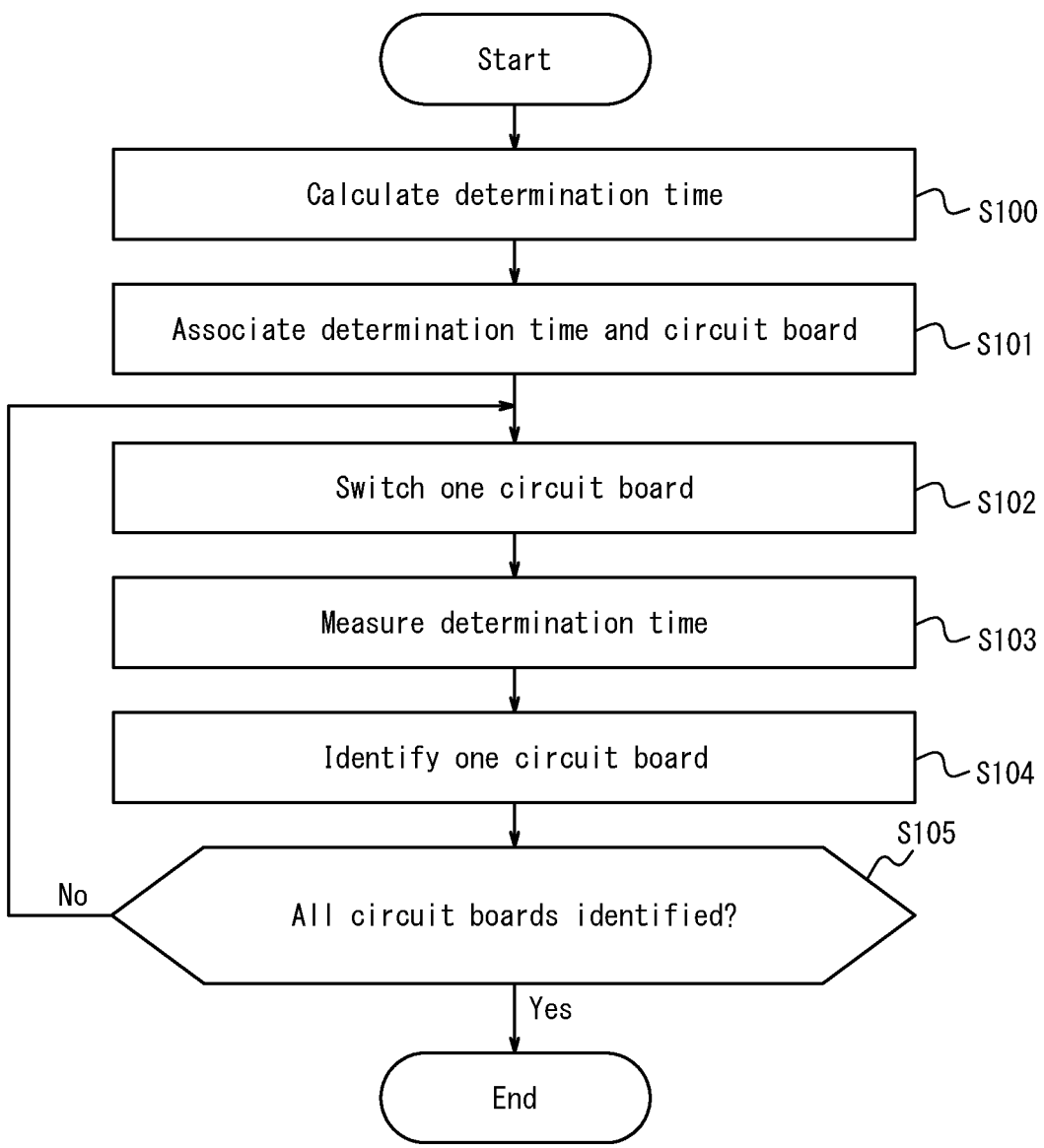
FIG. 3 is a flowchart illustrating an example of operations by the identification circuit in FIG. 1.

FIG. 3 is a flowchart illustrating an example of operations of the identification circuit 10 in FIG. 1. The flowchart in FIG. 3 is for an identification method using the identification circuit in FIG. 1 to identify one circuit board 30 among the plurality of circuit boards 30. With reference to FIG. 3, the processing by the controller 13 of the identification circuit 10 in FIG. 1 is described in greater detail.

In step S100, the controller 13 calculates the determination time T using Equations 2 through 5, based on the resistance value of the identification resistor Ri and the capacitance value of the capacitor Ci. For example, the controller 13 acquires the values of the various circuit element parameters included in Equations 2, 3, and 5, based on input information from the user as the developer of the identification circuit 10. The controller 13 ultimately calculates the determination time T by using Equation 5, based on the acquired values of the circuit element parameters.

In step S101, the controller 13 associates the determination time T calculated in step S100 and the one circuit board 30 with each other. At this time, the controller 13 stores the data in which the determination time T and the one circuit board 30 are associated with each other in any appropriate storage medium. Such a storage medium may be included in the identification circuit 10 itself as a storage or may be disposed as an external component not included in the identification circuit 10.

In step S102, the controller 13 switches the one circuit board 30 electrically connected to the identification circuit 10 among the plurality of circuit boards 30. For example, to identify the type of one circuit board 30 mounted in the connector 20, the controller 13 controls the switching element 11 to switch the connection relationship from another circuit board 30 to the one circuit board 30.

In step S103, the controller 13 measures the determination time T upon both the identification resistor Ri and the identification capacitor Ci being electrically connected to the circuit element group 12 of the identification circuit 10 by the switching of the one circuit board 30 in step S102. At this time, the determination time T is different for each circuit board 30 based on whichever of the identification resistor Ri and the identification capacitor Ci is connected, for example the identification capacitor Ci.

In step S104, the controller 13 identifies the one circuit board 30 based on the determination time T measured in step S103. At this time, the controller 13 identifies the one circuit board 30 by reading the data stored in the storage medium in step S101 and matching the determination time T measured in step S103 with the data.

In step S105, the controller 13 determines whether the identification process has been completed for all of the circuit boards 30. Upon determining that all of the circuit boards 30 have been identified, the controller 13 ends the process. The controller 13 executes the processing of step S102 again when judging that not all of the circuit boards 30 have been identified.

According to the identification circuit 10 of the first embodiment described above, costs can be sufficiently controlled. For example, the identification circuit 10 does not include an ADC, and the controller 13 does not need to control an ADC. The development cost is therefore reduced compared to conventional technology in which such an ADC is included in the identification circuit. The product cost is also reduced, since an ADC, which is an expensive circuit element, is not used in the identification circuit 10, but rather only inexpensive circuit elements are used.

In addition, the identification circuit 10 does not identify the one circuit board 30 based on the voltage range of the voltage Va, as in conventional technology. The influence of errors caused by the reference voltage V0, the reference resistor R0, the identification resistor Ri, and the comparator CMP on the identification accuracy of the one circuit board 30 is therefore sufficiently reduced. Moreover, the number of identified circuit boards 30 can easily be increased by changing the capacitance value of the identification capacitor Ci on the circuit board 30. As described above, the need to increase the precision of the identification circuit 10, the reference voltage V0, the reference resistor R0, the identification resistor Ri, the comparator CMP, and the like is reduced as compared to conventional technology. As a result, the identification circuit 10 can achieve further cost reduction compared to conventional technology.

If a circuit board 30 with a new function becomes necessary due to market needs, the newly designed circuit board 30 can easily be added to the plurality of circuit boards 30 for identification in the module 1 according to the present disclosure, which uses the identification circuit 10. More specifically, the circuit board 30 with the new function can be easily added to the plurality of circuit boards 30 for identification by simply adding a new determination time T in the identification method, performed by the identification circuit 10, that uses the time axis.

Although the determination time T may become longer by changing the identification capacitor Ci on the circuit board 30, problems are unlikely to occur in the actual operation of the identification circuit 10 even in this case, since the identification circuit 10 operates in the background, such as when the power is turned on.

The identification circuit 10 measures the determination time T, which is different for each circuit board 30, based on the identification resistor Ri and/or the identification capacitor Ci, which are connected to each other in parallel, included in the one circuit board 30. For example, the identification circuit 10 measures the determination time T based on the identification capacitor Ci. This configuration enables the user to design the capacitance value of the identification capacitor Ci of the circuit board 30 to differ for each circuit board 30, so that the identification circuit 10 can easily and accurately identify one circuit board 30 based on the determination time T.

In addition, by the identification resistor Ri and the identification capacitor Ci being connected in parallel with each other on the one circuit board 30, the identification capacitor Ci is discharged by the identification resistor Ri when the one circuit board 30 is not selected by the switching element 11. As a result, the charge on the identification capacitor Ci becomes zero. When one circuit board 30 is selected by the switching element 11 and the identification process of the one circuit board 30 by the identification circuit 10 starts, the controller 13 can therefore accurately measure the determination time T. The identification accuracy of the one circuit board 30 by the identification circuit 10 is thereby improved.

By calculating the determination time T based on the resistance value of the identification resistor Ri and the capacitance value of the identification capacitor Ci, the identification circuit 10 can acquire the determination parameters required for the identification process of the one circuit board 30 as the determination time T expressed by Equation 5. The identification circuit 10 can provide a new identification method using the time axis, which is completely different from an identification method using a voltage range as in conventional technology.

The circuit element group 12 includes the comparator CMP that outputs, to the controller 13, an electrical signal that changes from Lo to Hi when the determination time T elapses after the electrical connection is switched by the switching element 11 to the one circuit board 30. In this way, the controller 13 can accurately measure the determination time T. The identification accuracy of the one circuit board 30 by the identification circuit 10 is thereby improved.

In the first embodiment, the determination time T is different for each circuit board 30 based on the identification resistor Ru and/or the identification capacitor Ci that are electrically connected to the circuit element group 12, for example based on the identification capacitor Ci, but this configuration is not limiting. The determination time T may take a different value for each circuit board 30 based on the identification resistor Ri and/or the identification capacitor Ci.

For example, the capacitance value of the identification capacitor Ci may be identical for each circuit board 30, while the resistance value of the identification resistor Ri differs for each circuit board 30. At this time, the determination time T is different for each circuit board 30 based on the resistance value of the identification resistor Ri, which differs for each circuit board 30. For example, the capacitance value of the identification capacitor Ci may differ for each circuit board 30, and the resistance value of the identification resistor Ri may also differ for each circuit board 30. At this time, the determination time T is different for each circuit board 30 based on both the identification resistor Ri and the identification capacitor Ci, which differ for each circuit board 30.

In the first embodiment, the switching element 11 has been described as including a multiplexer, but this configuration is not limiting. The switching element 11 may include any circuit element capable of switching the electrical connection relationship between one circuit board 30 among the plurality of circuit boards 30 and the identification circuit 10.

In the first embodiment, the circuit element group 12 has been described as including a circuit configuration such as the one illustrated in FIG. 1, but this configuration is not limiting. The circuit element group 12 may include any circuit configuration that can achieve the above identification method by the identification circuit 10.

In the first embodiment, the controller 13 of the identification circuit 10 has been described as executing the processing illustrated in steps S100 and S101 of FIG. 3, but this configuration is not limiting. Any other processor may execute similar processing instead of the controller 13 of the identification circuit 10, and data in which the determination time T and the one circuit board 30 are associated with each other may be stored in any of the storage media described above. The controller 13 of the identification circuit 10 may identify the one circuit board 30 by reading the data thus stored in the storage medium in step S104 of FIG. 3.

Second Embodiment

Figure 4:
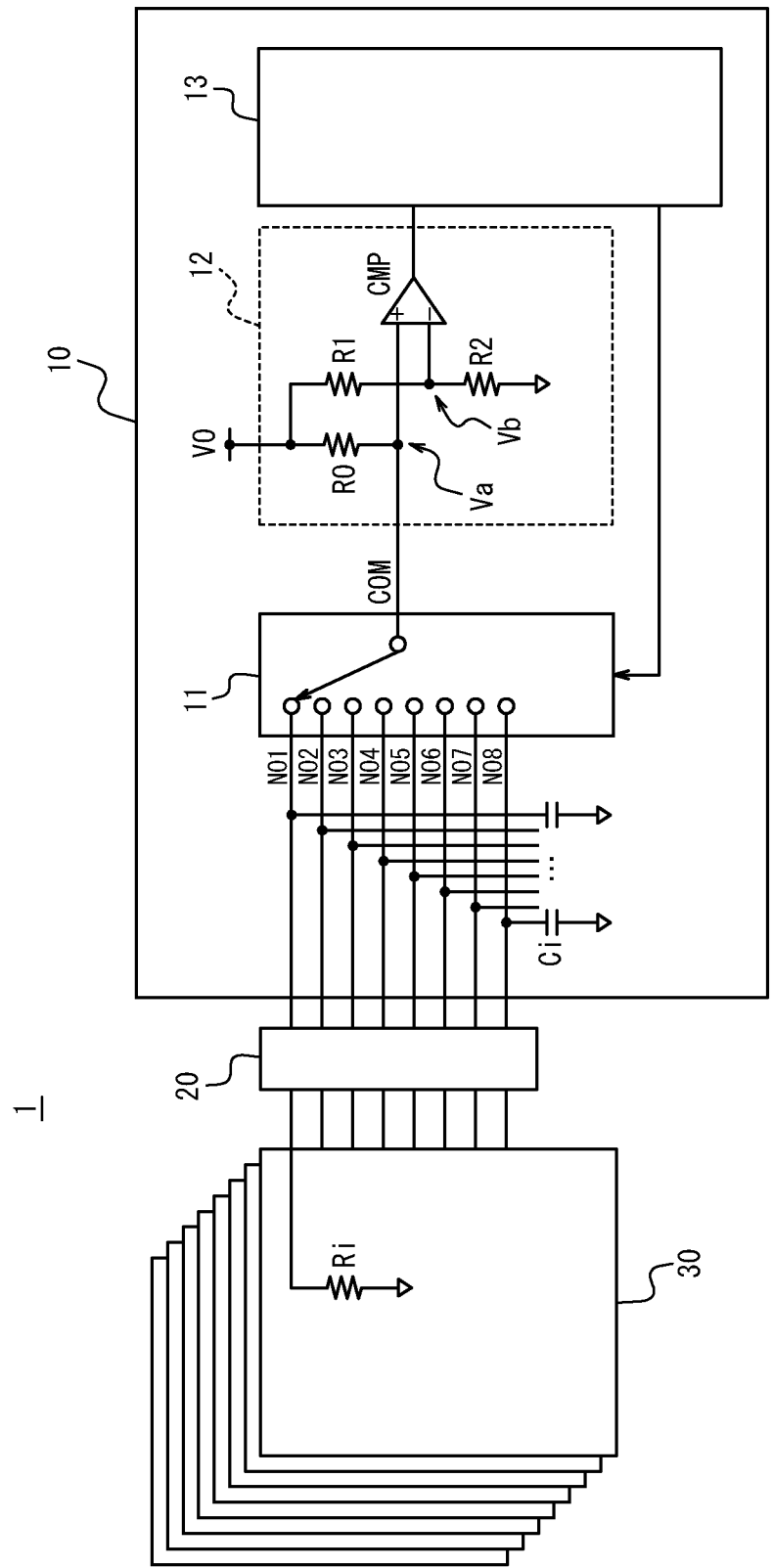
FIG. 4 is a configuration diagram schematically illustrating an identification circuit according to a second embodiment of the present disclosure.

FIG. 4 is a configuration diagram schematically illustrating an identification circuit 10 according to a second embodiment of the present disclosure. The configuration and operations of the identification circuit 10 according to the second embodiment are mainly described with reference to FIG. 4. The identification circuit 10 according to the second embodiment differs from the first embodiment in that the identification circuit 10 itself, rather than the circuit board 30, includes the identification capacitor Ci. The other configurations, functions, effects, variations, and the like are the same as those of the first embodiment, and the corresponding descriptions also apply to the identification circuit 10 according to the second embodiment.

Configurations that are the same as in the first embodiment are labeled below with the same reference signs, and a description thereof is omitted. The points that differ from the first embodiment are mainly explained.

The identification circuit 10 according to the second embodiment includes an identification capacitor Ci in addition to a switching element 11, a circuit element group 12, and a controller 13. The identification capacitor Ci is connected to a terminal of the switching element 11 on the one circuit board 30 side of the switching element 11. More specifically, the identification capacitor Ci is not disposed on the circuit board 30 but rather is connected to each of the connection terminals NO1, NO2, NO3, NO4, NO5, NO6, NO7, and NO8 in the switching element 11 of the identification circuit 10.

The controller 13 measures the determination time T in a similar way to the first embodiment, upon the identification resistor Ri of the one circuit board 30 and the corresponding identification capacitor Ci of the identification circuit 10 being electrically connected to the circuit element group 12 via the switching element 11. At this time, the determination time T is different for each circuit board 30 based on the connected resistor Ri and/or identification capacitor Ci. The determination time T in this case is expressed by Equation 5 as in the first embodiment.

For example, the controller 13 measures the determination time T, which is different for each circuit board 30, based on the identification resistor Ri included in the one circuit board 30. At this time, the capacitance value of the identification capacitor Ci included in the identification circuit 10 is identical for each circuit board 30, whereas the resistance value of the identification resistor Ri included in the circuit board 30 differs for each circuit board 30.

The controller 13 identifies the one circuit board 30 based on the measured determination time T.

According to the above-described identification circuit 10 of the second embodiment, the same effects as those of the first embodiment are achieved. In addition, by having the identification capacitor Ci be included in the identification circuit 10 instead of in the circuit board 30, the identification circuit 10 according to the second embodiment can perform the identification process for existing circuit boards 30 in which the identification capacitor Ci is not provided. This improves the compatibility of the identification circuit 10 with existing circuit boards 30.

The identification circuit 10 measures the determination time T, which is different for each circuit board 30, based on the identification resistor Ri included in the one circuit board 30. This configuration enables the user to design the resistance value of the identification resistor Ri of the circuit board 30 to differ for each circuit board 30, so that the identification circuit 10 can easily and accurately identify one circuit board 30 based on the determination time T.

By the identification capacitor Ci being connected to the terminal of the switching element 11 on the one circuit board 30 side of the switching element 11, the identification circuit 10 can identify one circuit board 30 based on the same identification method as in the first embodiment when the one circuit board 30 is selected by the switching element 11.

In the second embodiment, the controller 13 has been described as measuring the determination time T, which is different for each circuit board 30, based on the identification resistor Ri included in the one circuit board 30, but this configuration is not limiting. The controller 13 may measure the determination time T, which is different for each circuit board 30, based on the identification capacitor Ci included in the identification circuit 10. At this time, the capacitance value of the identification capacitor Ci included in the identification circuit 10 differs for each circuit board 30, whereas the resistance value of the identification resistor Ri included in the circuit board 30 is identical for each circuit board 30.

The above configuration is not limiting, and the controller 13 may measure the determination time T, which is different for each circuit board 30, based on both the identification resistor Ri included in the one circuit board 30 and the identification capacitor Ci included in the identification circuit 10. At this time, the capacitance value of the identification capacitor Ci included in the identification circuit 10 differs for each circuit board 30, and the resistance value of the identification resistor Ri included in the circuit board 30 also differs for each circuit board 30.

Third Embodiment

Figure 5:
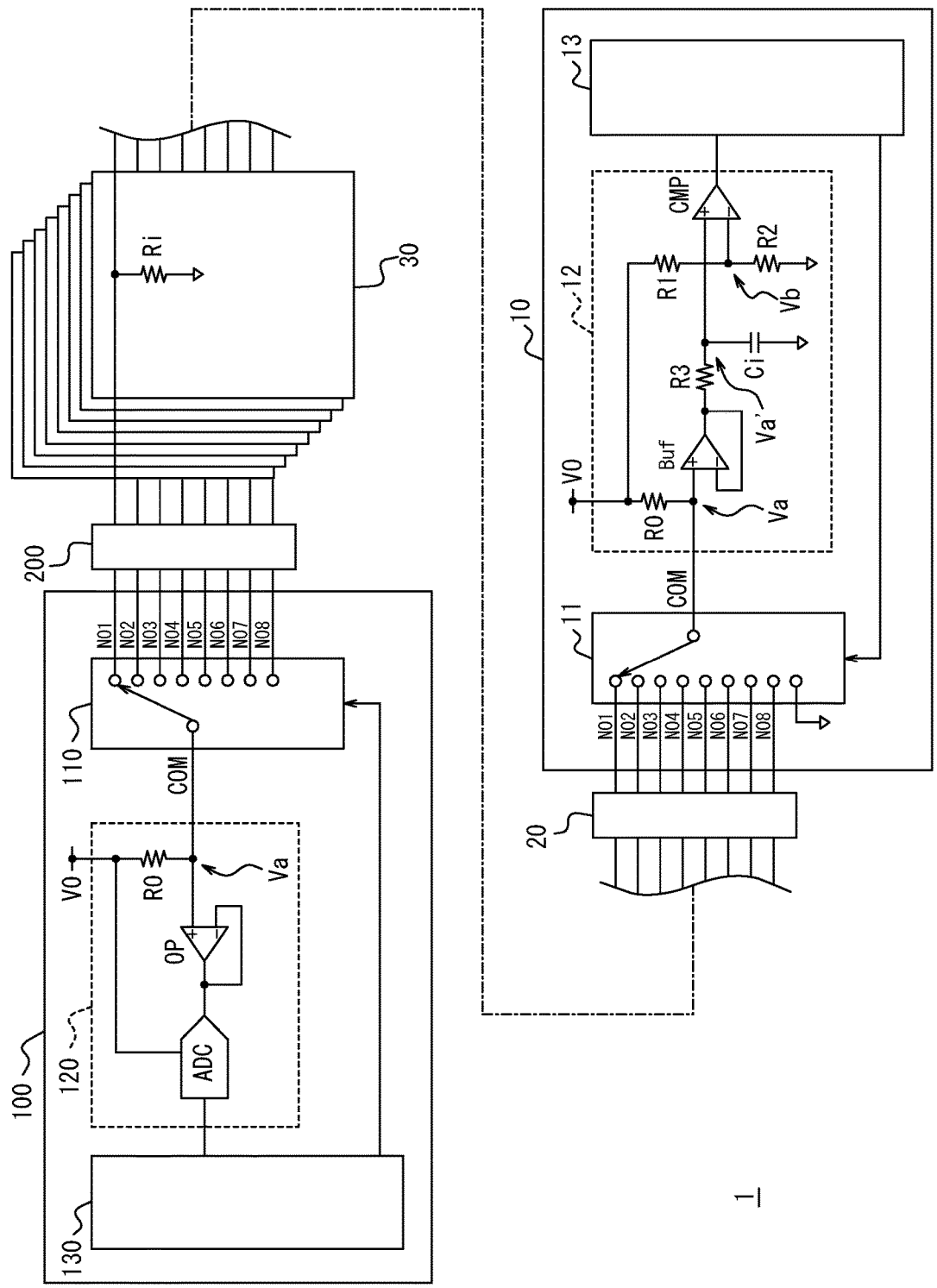
FIG. 5 is a configuration diagram schematically illustrating an identification circuit according to a third embodiment of the present disclosure.

FIG. 5 is a configuration diagram schematically illustrating an identification circuit 10 according to a third embodiment of the present disclosure. The configuration and operations of the identification circuit 10 according to the third embodiment are mainly described with reference to FIG. 5. The identification circuit 10 according to the third embodiment differs from that of the first embodiment in that the identification capacitor Ci is included in the circuit element group 12 of the identification circuit 10 instead of in the circuit board 30, and the circuit element group 12 also includes a buffer circuit Buf. The other configurations, functions, effects, variations, and the like are the same as those of the first embodiment, and the corresponding descriptions also apply to the identification circuit 10 according to the third embodiment. Configurations that are the same as in the first embodiment are labeled below with the same reference signs, and a description thereof is omitted. The points that differ from the first embodiment will mainly be explained.

In addition to an identification circuit 10, a connector 20, and a plurality of circuit boards 30 mounted on the connector 20, a module 1 in the third embodiment further includes a conventional identification circuit 100 and a connector 200 that are connected to the plurality of circuit boards 30 in parallel with the identification circuit 10. The module 1 includes the conventional identification circuit 100 on the standby side as a circuit for when the identification circuit 10, which is on the active side, fails for some reason and becomes inoperable. The module 1 is configured as a duplexed system including the identification circuit 10 on the active side and the identification circuit 100 on the standby side.

The identification circuit 10 according to the third embodiment includes a circuit element group 12 and an identification capacitor Ci. More specifically, the circuit element group 12 includes a buffer circuit Buf and includes a resistor R3 and the identification capacitor Ci connected in this order to the buffer circuit Buf in series.

In the module 1, a switching element 11 of the identification circuit 10 and a switching element 110 of the conventional identification circuit 100 operate asynchronously. Consider a hypothetical case in which the identification capacitor Ci is connected to each connection terminal in the switching element 11, as in the second embodiment. If one circuit board 30 were asynchronously and accidentally selected simultaneously by the switching element 11 and the switching element 110, then settling by the identification capacitor Ci would affect the AD conversion value in the ADC on the conventional identification circuit 100, and a FAIL condition would occur.

More specifically, the voltage Va on the identification circuit 100 side also exhibits a transient response due to the identification capacitor Ci connected to each connection terminal in the switching element 11. If the response characteristic of the ADC included in the conventional identification circuit 100 does not correspond to the capacitance value of the identification capacitor Ci, the ADC may output a digital signal before the voltage Va rises fully. In this case, the ADC would output a digital signal corresponding to a voltage completely different from the original voltage Va. The controller 130 of the identification circuit 100 would then incorrectly identify the one circuit board 30 as a different circuit board 30.

The buffer circuit Buf of the identification circuit 10 functions as a buffer for suppressing the aforementioned effects on the identification circuit 100 from the identification capacitor Ci that is connected in series to the buffer circuit Buf. At this time, the voltage Va at the non-inverting input terminal of the buffer circuit Buf and the voltage Va' on the output terminal side are identical. The output characteristics of the voltage Va (equal to the voltage Va') and output characteristics of the comparator CMP are similar to those described in the first embodiment with reference to FIG. 2. Only the formula for the determination time T is slightly different from the first embodiment. In the third embodiment, the determination time T is expressed by Equation 6 below.

$$T = -Ci \times R3 \times \ln\left(1 - \frac{Vb}{Va_{max}}\right) \quad \text{(Equation 6)}$$

As illustrated in Equation 6, the controller 13 of the identification circuit 10 calculates the determination time T based on the resistance value of the resistor R3 and the capacitance value of the identification capacitor Ci, which are connected in this order to the buffer circuit Buf in series. In Equation 6, the values of the resistor R3 and the identification capacitor Ci are constant for each of the circuit boards 30. However, the voltage $Va_{max}$ depends on the identification resistor Ri, and the resistance value of the identification resistor Ri is different for each of the circuit boards 30. The determination time T is therefore different for each circuit board 30.

The controller 13 measures the determination time T in a similar way to the first embodiment, upon only the identification resistor Ri of the one circuit board 30 being electrically connected to the circuit element group 12 via the switching element 11. At this time, the determination time T is different for each circuit board 30 based on the connected identification resistor Ri, as expressed by Equation 6.

The controller 13 identifies the one circuit board 30 based on the measured determination time T. Before executing the identification process of the one circuit board 30, the controller 13 controls the switching element 11 so that the circuit element group 12 is connected to the grounded terminal of the switching element 11. As a result, the identification capacitor Ci is discharged.

According to the above-described identification circuit 10 of the third embodiment, the same effects as those of the first embodiment are achieved. In addition, by having the identification capacitor Ci be included in the circuit element group 12 of the identification circuit 10 instead of in the circuit board 30, the identification circuit 10 according to the third embodiment can perform the identification process for existing circuit boards 30 in which the identification capacitor Ci is not provided. This improves the compatibility of the identification circuit 10 with existing circuit boards 30.

By the circuit element group 12 including the buffer circuit Buf and including the resistor R3 and the identification capacitor Ci connected in this order to the buffer circuit Buf in series, the effect on the identification circuit 100 from the identification capacitor Ci is suppressed. The identification circuit 100 can thereby accurately identify the one circuit board 30.

By calculating the determination time T based on the resistance value of the resistor R3 and the capacitance value of the identification capacitor Ci, the identification circuit 10 can acquire the determination parameters required for the identification process of the one circuit board 30 as the determination time T expressed by Equation 6. The identification circuit 10 can provide a new identification method using the time axis, which is completely different from an identification method using a voltage range as in conventional technology.

In the above third embodiment, the buffer circuit Buf included in the circuit element group 12 has been described as being a voltage follower, but this configuration is not limiting. The buffer circuit Buf may be configured as an amplifier circuit.

Although the present disclosure is based on embodiments and drawings, it is to be noted that various changes and modifications will be apparent to those skilled in the art based on the present disclosure. Therefore, such changes and modifications are to be understood as included within the scope of the present disclosure. For example, the functions and the like included in the various configurations and steps may be reordered in any logically consistent way. Furthermore, components or steps may be combined into one or divided.

For example, the present disclosure may also be embodied as a program containing a description of the processing for achieving the functions of the above-described identification circuit 10 or a storage medium with the program recorded thereon. Such embodiments are also to be understood as falling within the scope of the present disclosure.

For example, the arrangement and number of the above-described components are not limited to the above explanation or the drawings. The arrangement and number of each component may be selected freely as long as the functions of the component can be achieved.

In each of the above embodiments, the circuit board 30 has been described as always including the identification resistor Ri, but this configuration is not limiting. The circuit board 30 may include only the identification capacitor Ci, without including the identification resistor Ri. In this case, the module 1 includes a separate circuit for discharging the identification capacitor Ci.

The invention claimed is:

1. An identification circuit for identifying one circuit board among a plurality of circuit boards, the identification circuit comprising:
    a switching element configured to switch the one circuit board electrically connected to the identification circuit among the plurality of circuit boards;
    a circuit element group electrically connected to the switching element; and
    a controller electrically connected to the switching element and the circuit element group, wherein
    upon an identification resistor and/or an identification capacitor being electrically connected to the circuit element group via the switching element, the controller is configured to measure a determination time, which is different for each circuit board, based on the connected identification resistor and/or the connected identification capacitor and to identify the one circuit board based on the measured determination time,
    the identification circuit is electrically connected to the plurality of circuit boards via a connector, and
    the circuit element group comprises:
    a first resistor having one end connected to a reference voltage;
    a second resistor connected in parallel to the first resistor and having one end connected to the reference voltage and the one end of the first resistor;
    a third resistor connected in series to the second resistor and having one end grounded and another end connected to another end of the second resistor; and
    a comparator having
        a non-inverting input terminal connected to another end of the first resistor and the switching element,
        an inverting input terminal connected to the other end of the second resistor and the other end of the third resistor, and
        an output terminal connected to the controller.

2. The identification circuit according to claim 1, wherein the controller is configured to measure the determination time, which is different for each circuit board, based on the identification resistor and/or the identification capacitor that are connected to each other in parallel and are included in the one circuit board.

3. The identification circuit according to claim 1, wherein the controller is configured to calculate the determination time based on a resistance value of the identification resistor and a capacitance value of the identification capacitor.

4. The identification circuit according to claim 1, wherein
    the circuit element group includes a comparator configured to output, to the controller, an electrical signal that changes from Lo to Hi when the determination time elapses after electrical connection is switched to the one circuit board by the switching element, and
    the controller is configured to measure the determination time based on the electrical signal.

5. The identification circuit according to claim 1, wherein the circuit element group further comprises:
    a fourth resistor having one end connected to the non-inverting input terminal of the comparator;
    the identification capacitor having one electrode grounded and another electrode connected to the one end of the fourth resistor and the non-inverting input terminal of the comparator; and
    a buffer circuit having
        a non-inverting input terminal connected to the other end of the first resistor and the switching element,
        an inverting input terminal, and
        an output terminal connected to the inverting input terminal and another end of the fourth resistor.

6. The identification circuit according to claim 1, further comprising
    the identification capacitor, wherein
    the controller is configured to measure the determination time, which is different for each circuit board, based on the identification resistor included in the one circuit board.

7. The identification circuit according to claim 6, wherein the identification capacitor is connected to a terminal of the switching element on the one circuit board side of the switching element.

8. The identification circuit according to claim 6, wherein the circuit element group includes a buffer circuit and includes a fourth resistor and the identification capacitor connected in this order to the buffer circuit in series.

9. The identification circuit according to claim 8, wherein the controller is configured to calculate the determination time based on a resistance value of the fourth resistor and a capacitance value of the identification capacitor.

10. An identification method using an identification circuit for identifying one circuit board among a plurality of circuit boards, the identification circuit comprising a switching element, a circuit element group electrically connected to the switching element, and a controller electrically connected to the switching element and the circuit element group, the identification method comprising:
    Switching, by the switching element, the one circuit board electrically connected to the identification circuit among the plurality of circuit boards;
    measuring, by the controller, upon an identification resistor and/or an identification capacitor being electrically connected to the circuit element group by the switching element switching the one circuit board, a determination time, which is different for each circuit board, based on the connected identification resistor and/or the connected identification capacitor; and identifying, by the controller, the one circuit board based on the measured determination time, wherein the identification circuit is electrically connected to the plurality of circuit boards via a connector, and the circuit element group comprises:

a first resistor having one end connected to a reference voltage;

a second resistor connected in parallel to the first resistor and having one end connected to the reference voltage and the one end of the first resistor;

a third resistor connected in series to the second resistor and having one end grounded and another end connected to another end of the second resistor; and a comparator having
- a non-inverting input terminal connected to another end of the first resistor and the switching element,
- an inverting input terminal connected to the other end of the second resistor and the other end of the third resistor, and
- an output terminal connected to the controller.

11. The identification method according to claim 10, further comprising calculating, by the controller, the determination time based on a resistance value of the identification resistor and a capacitance value of the identification capacitor.

* * * * *